US010193063B2

(12) United States Patent
Paz de Araujo et al.

(10) Patent No.: US 10,193,063 B2
(45) Date of Patent: Jan. 29, 2019

(54) SWITCHING DEVICE FORMED FROM CORRELATED ELECTRON MATERIAL (71) Applicant: ARM Ltd., Cambridge (GB)

(72) Inventors: Carlos Alberto Paz de Araujo, Colorado Springs, CO (US); Jolanta Bozena Celinska, Colorado Springs, CO (US); Kimberly Gay Reid, Austin, TX (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/367,052

(22) Filed: Dec. 1, 2016

(65) Prior Publication Data

US 2018/0159031 A1  Jun. 7, 2018

(51) Int. Cl.
*H01L 45/00* (2006.01)
*H01L 27/24* (2006.01)

(52) U.S. Cl.
CPC ........ *H01L 45/1253* (2013.01); *H01L 27/249* (2013.01); *H01L 45/04* (2013.01); *H01L 45/146* (2013.01); *H01L 45/1608* (2013.01); *H01L 45/1633* (2013.01)

(58) Field of Classification Search
None
See application file for complete search history.

(56) References Cited

U.S. PATENT DOCUMENTS

| | | | |
|---|---|---|---|
| 6,020,024 A * | 2/2000 | Maiti | H01L 21/28185 257/E29.16 |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 * | 1/2011 | Paz de Araujo | H01L 45/04 365/148 |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |

(Continued)

FOREIGN PATENT DOCUMENTS

| | | |
|---|---|---|
| JP | 2011114202 A | 6/2011 |
| WO | 2010115924 A1 | 10/2010 |

OTHER PUBLICATIONS

Notification of Transmittal of the International Search Report and the Written Opinion of the International Searching Authority, or the Declaration, App. No. PCT/GB2017/053614, dated Apr. 20, 2018, 21 Pages.

(Continued)

*Primary Examiner* — Fazli Erdem (74) *Attorney, Agent, or Firm* — Berkeley Law & Technology Group, LLP (57) ABSTRACT Subject matter disclosed herein may relate to fabrication of a correlated electron material (CEM) switch. In embodiments, processes are described in which conductive traces may be formed on or over an insulating material. Responsive to forming voids in the insulating material, localized portions of the conductive traces in contact with the voids may be exposed to gaseous oxidizing agents, which may convert the localized portions of the conductive traces to a CEM. In embodiments, an electrode material may be deposited within the voids to contact the localized portion of conductive trace converted to the CEM.

10 Claims, 5 Drawing Sheets

500

510
Form, in a chamber, one or more voids between adjacent conductive traces of a plurality of conductive traces formed over an insulating substrate 520
Convert localized portions of at least some of the adjacent conductive traces of the plurality of conductive traces to a CEM, the CEM comprising an atomic concentration of at least 85.0% of a d-block or an f-block material, or an alloy of the two or more d-block or f-block materials (56) References Cited

U.S. PATENT DOCUMENTS

| | | | |
|---|---|---|---|
| 9,627,615 B1 | 4/2017 | Reid et al. | |
| 9,660,189 B1 * | 5/2017 | Reid | H01L 45/085 |
| 2006/0134846 A1 * | 6/2006 | Wang | H01L 21/02164 |
| | | | 438/211 |
| 2008/0106925 A1 * | 5/2008 | Paz de Araujo | H01L 45/04 |
| | | | 365/148 |
| 2008/0106926 A1 * | 5/2008 | Brubaker | H01L 27/2409 |
| | | | 365/148 |
| 2008/0107801 A1 * | 5/2008 | Celinska | H01L 45/04 |
| | | | 427/96.7 |
| 2009/0152526 A1 | 6/2009 | Courtade et al. | |
| 2011/0175050 A1 | 7/2011 | Chien et al. | |
| 2013/0200323 A1 | 8/2013 | Pham et al. | |
| 2013/0214232 A1 | 8/2013 | Tendulkar et al. | |
| 2013/0217199 A1 * | 8/2013 | Huang | H01L 45/04 |
| | | | 438/382 |
| 2013/0285699 A1 | 10/2013 | McWilliams et al. | |
| 2016/0163978 A1 | 6/2016 | Paz De Araujo et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |
| 2017/0092858 A1 * | 3/2017 | Shifren | H01L 49/003 |
| 2017/0237001 A1 * | 8/2017 | Reid | H01L 45/145 |
| | | | 257/4 |

OTHER PUBLICATIONS

Invitation to Pay Additional Fees and, Where Applicable Protest Fee, App. No. PCT/GB2017/053614, dated Feb. 28, 2018, 14 Pages.

\* cited by examiner

SWITCHING DEVICE FORMED FROM CORRELATED ELECTRON MATERIAL

BACKGROUND

Field

This disclosure relates to correlated electron devices, and may relate, more particularly, to approaches for fabricating correlated electron devices, such as may be used in switches, memory circuits, and so forth, which may exhibit desirable impedance switching characteristics.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed. However, conventional fabrication techniques, which may be well suited for certain types of memory and/or logic devices, may not be suitable for use in fabricating devices that utilize correlated electron materials.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in resistive RAM devices. In one aspect, a substantially rapid conductor-to-insulator transition in a CEM device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition.

In implementations, a CEM may comprise one or more "d-block" elements from of the periodic table of the elements, such as transition metals, transition metal compounds, one or more transition metal oxides (TMOs), for example. CEM devices may also be implemented utilizing one or more "f-block" elements of the periodic table of the elements, such as rare earth elements, oxides of rare earth elements, oxides comprising one or more rare earth transitional metals, perovskites, yttrium, and/or ytterbium, or any other compounds comprising metals from the lanthanide or actinide series of the periodic table of the elements, for example, and claimed subject matter is not limited in scope in this respect. Accordingly, in embodiments, a CEM may comprise oxides of one or more d-block elements and/or oxides of one or more f-block elements, having an atomic concentration of at least 85.0%, for example, with the remaining portion of the CEM comprising a dopant such as, for example, carbon or nitrogen. Thus, in this context, as the term is used herein, a d-block element means an element comprising Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. Also in this context, a CEM formed from or comprising an "f-block" element of the periodic table of the elements means a CEM comprising a metal or metal oxide from f-block of the periodic table of the elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), *neptunium* (Np), plutonium (Pu), americium (Am), berkelium (Bk), californium (Cf), einsteinium (Es), fermium (Fm), mendelevium (Md), nobelium (No) or lawrencium (Lr), or any combination thereof.

Figure 1A:
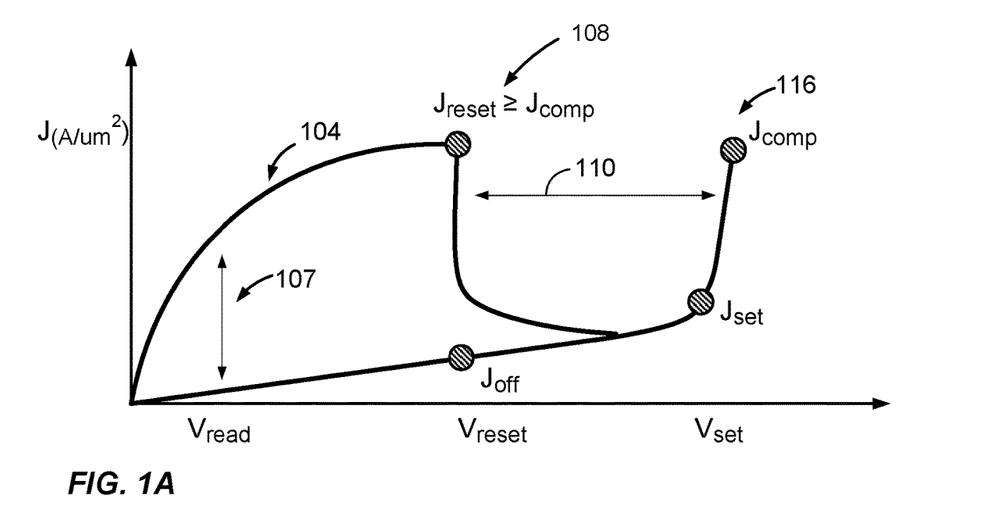
FIG. 1A is an illustration of an embodiment of a current density versus voltage profile of a device formed from a correlated electron material.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM device to a relatively low-impedance memory state. Conversely, application of a voltage $V_{reset}$ and a current density $J_{reset}$ may bring about a transition of the CEM device to a relatively high-impedance memory state. As shown in FIG. 1A, reference designator 110 illustrates the voltage range that may separate $V_{set}$ from $V_{reset}$. Following placement of the CEM device into a high-impedance state or into a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any d-block or f-block material from the periodic table of the elements. In one aspect, the CEM device of FIG. 1A may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM may be more conductive in a low-impedance state. Thus, in another particular example, NiO doped with extrinsic ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S), and others.

In this context, a "P-type" doped CEM as referred to herein means a first type of CEM comprising a particular molecular dopant that exhibits increased electrical conductivity, relative to an undoped CEM, if the CEM is operated in a low-impedance state. Introduction of a substitutional ligand, such as CO and $NH_3$, may operate to enhance the P-type nature of a NiO CEM. Accordingly, an attribute of P-type operation of a CEM may include, at least in particular embodiments, an ability to tailor or customize electrical conductivity of a CEM, operated in a low-impedance state, by controlling an atomic concentration of a P-type dopant in a CEM. In particular embodiments, an increased atomic concentration of a P-type dopant may bring about increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper slope (e.g., higher conductivity) of region 104.

In another embodiment, the CEM device of FIG. 1A may comprise other transition metal oxide variable impedance materials, such as nitrogen-containing ligands, though it should be understood that these are exemplary only and are not intended to limit claimed subject matter. NiO, for example, may be doped with extrinsic nitrogen-containing ligands, which may stabilize variable impedance properties in a manner similar to stabilization of variable impedance properties brought about by use of carbon-based dopants (e.g., carbonyl). In particular, NiO variable impedance materials disclosed herein may include nitrogen-containing molecules of the form $C_xH_yN_z$ (wherein $x \geq 0$, $y \geq 0$, $z \geq 0$, and wherein at least x, y, or z comprise values>0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenedi amine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein $x \geq 0$ and $y \geq 0$ and at least x or y comprise values>0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM device may switch from a relatively low-impedance state to a relatively high-impedance state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally applied compliance current may, in some embodiments, also set a condition of a current density for a subsequent reset operation to place the CEM device into a relatively high-impedance state. As shown in the particular implementation of FIG. 1A, a current density $J_{comp}$ may be applied during a write operation at point 116 to place the CEM device into a relatively low-impedance state, which may determine a compliance condition for placing the CEM device into a high-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

In embodiments, compliance may set a number of electrons in a CEM device that may be "captured" by holes for the Mott transition. In other words, a current applied in a write operation to place a CEM device into a relatively low-impedance memory state may determine a number of holes to be injected to the CEM device for subsequently transitioning the CEM device to a relatively high-impedance memory state.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

In expression (2), $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In expression (3), $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance state.

According to an embodiment, a CEM device, which may be utilized to form a CEM switch, a CERAM memory device, or a variety of other electronic devices comprising one or more correlated electron materials, may be placed into a relatively low-impedance memory state, such as by transitioning from a relatively high-impedance state, for example, via injection of a sufficient quantity of electrons to satisfy a Mott transition criteria. In transitioning a CEM device to a relatively low-impedance state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more electrons to a transition metal, transition metal oxide, or any combination thereof, by an adjacent molecule of a lattice structure, for example, comprising the transition metal, transition metal compound, transition metal oxide, or comprising a combination thereof. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+(e.g., $Ni^{2+}$ in a material, such as NiO:CO or NiO:$NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance state.

In embodiments, depending on a molecular concentration of NiO:CO or NiO:$NH_3$, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of an electron back-donating material, such as NiO:CO or NiO:$NH_3$ and other materials present in the CEM device, as well as other process variations, and claimed subject matter is not limited in this respect.

Figure 1B:
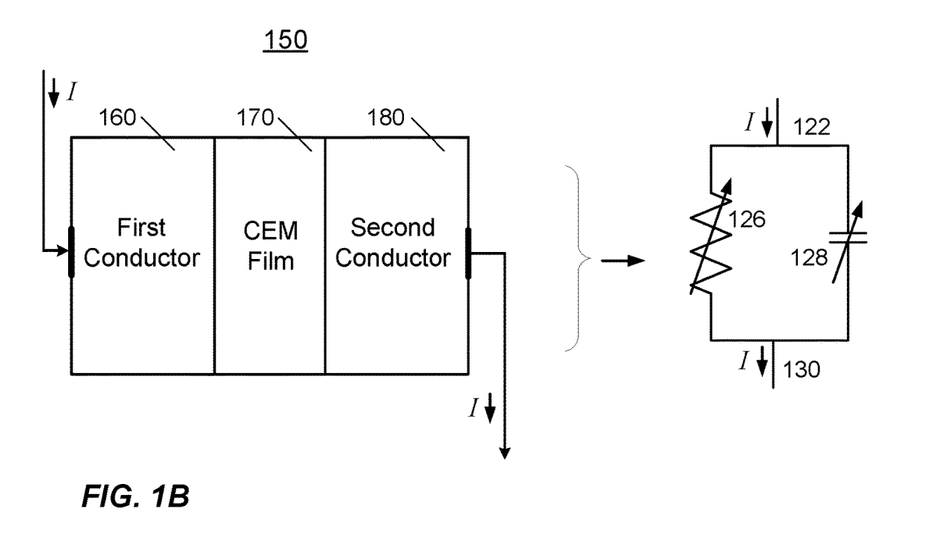
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a first conductor 160, CEM film 170, and second conductor 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM film and claimed subject matter is not limited in this respect.

Table 1 below depicts an example truth table for an example variable impedance device, such as the device of embodiment 150.

TABLE 1

| Correlated Electron Switch Truth Table | | |
|---|---|---|
| Resistance | Capacitance | Impedance |
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM device.

In certain embodiments, atomic layer deposition may be utilized to form or to fabricate films comprising NiO materials, such as NiO:CO or NiO:$NH_3$. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness of a single atom, which may comprise a thickness of a fraction of an angstrom (e.g., 0.6 Å). However, a layer encompasses a sheet or coating having a thickness greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance state. Also during operation in a circuit environment, for example, electron back-donation may be reversed so as to give rise to a substantially dissimilar impedance state, such as a high-impedance state, for example.

Also in this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, a conductive substrate may operate in a manner similar to first conductor 160 to convey an electrical current to a CEM film in contact with conductive substrate 160. In another example, a substrate may operate to insulate a CEM film to prohibit electrical current flow to or from the CEM film. In one possible example of an insulating substrate, a material such as silicon nitride (SiN) may be employed to insulate components of semiconductor structures. Further, an insulating substrate may comprise other silicon-based materials such as silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal back end, and/or other semiconductor structures and/or technologies, including CES devices, for example. Accordingly, claimed subject matter is intended to embrace a wide variety of conductive and insulating substrates without limitation.

In particular embodiments, formation of CEM films on or over a substrate may utilize two or more precursors to deposit components of, for example, NiO:CO or NiO:$NH_3$, or other transition metal oxide, transition metal, or combination thereof, onto a conductive material such as a substrate. In an embodiment, layers of a CEM film may be deposited utilizing separate precursor molecules, AX and BY, according to expression (6a), below:

$$AX_{(gas)} + BY_{(gas)} = AB(solid) + XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate ($YTiO_3$).

In embodiments, "X" of expression (6a) may comprise a ligand, such as organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-amino-pent-2-en-4-onato $(apo)_2$, $(dmamb)_2$ where dmamb=1-dimethylamino-2-methyl-2-butanolate, $(dmamp)_2$ where dmamp=1-dimethylamino-2-methyl-2-propanolate, Bis (pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl (Ni($Cp)_2$), nickel diethylcyclopentadienyl (Ni($EtCp)_2$), Bis(2,2,6,6-tetramethylheptane-3,5-dionato)Ni(II) (Ni$(thd)_2$), nickel acetylacetonate (Ni$(acac)_2$), bis(methylcyclopentadienyl)nickel (Ni $(CH_3C_5H_4)_2$, Nickel dimethylglyoximate (Ni$(dmg)_2$), Nickel 2-amino-pent-2-en-4-onato (Ni$(apo)_2$), Ni$(dmamb)_2$ where dmamb=1-dimethylamino-2-methyl-2-butanolate, Ni$(dmamp)_2$ where dmamp=1-dimethylamino-2-methyl-2-propanolate, Bis(pentamethylcyclopentadienyl) nickel (Ni $(C_5(CH_3)_5)_2$, and nickel carbonyl (Ni$(CO)_4$), just to name a few examples.

However, in particular embodiments, a dopant comprising an electron back-donating material in addition to precursors AX and BY may be utilized to form layers of a CEM device. An additional dopant ligand comprising an electron back-donating material, which may co-flow with precursor AX, may permit formation of electron back-donating compounds, substantially in accordance with expression (6b), below. In embodiments, a dopant comprising an electron back-donating material, such as ammonia ($NH_3$), methane ($CH_4$), carbon monoxide (CO), or other material may be utilized, as may other ligands comprising carbon or nitrogen or other dopants comprising electron back-donating materials listed above. Thus, expression (6a) may be modified to include an additional dopant ligand comprising an electron back-donating material substantially in accordance with expression (6b), below:

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentration, of precursors, such as AX, BY, and $NH_3$ (or other ligand comprising nitrogen) of expressions (6a) and (6b) may be adjusted so as to bring about a final atomic concentration of nitrogen or carbon dopant comprising an electron back-donating material in a fabricated CEM device, such as in the form of ammonia ($NH_3$) or carbonyl (CO) comprising a concentration of between approximately 0.1% and 10.0%. However, claimed subject matter is not necessarily limited to the above-identified precursors and/or atomic concentrations. Rather, claimed subject matter is intended to embrace all such precursors utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices. In expressions (6a) and (6b), "BY" may comprise an oxidizer, such as water ($H_2O$), oxygen ($O_2$), ozone ($O_3$), plasma $O_2$, hydrogen peroxide ($H_2O_2$), as previously mentioned. In other embodiments, "BY" may comprise CO, $O_2$+($CH_4$), or nitric oxide (NO)+water ($H_2O$) or an oxynitride or a carbon-containing gaseous oxidizing or oxynitriding agent. In other embodiments, plasma may be used with an oxidizer (BY) to form oxygen radicals (O*). Likewise, plasma may be used with a doping species comprising an electron back-donating material to form an activated species to control the doping concentration of a CEM.

In particular embodiments, such as embodiments utilizing atomic layer deposition, a substrate, such as a conductive substrate, may be exposed to precursors, such as AX and BY, as well as dopants comprising electron back-donating materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:$NH_3$, for example, is performed, chamber temperature ranges approximately in the range of 20.0° C. and 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, $NH_3$, $CH_4$, or other ligand comprising nitrogen, carbon or other dopant comprising an electron back-donating material, and BY, as described with reference to expression 6(b)) utilizing atomic layer deposition may bring about a layer of a CEM film comprising a thickness approximately in the range of 0.6 Å to 5.0 Å per cycle). Accordingly, in an embodiment, to form a CEM device film comprising a thickness of approximately 500.0 Å utilizing an atomic layer deposition process in which layers comprise a thickness of approximately 0.6 Å, 800-900 cycles, for example, may be utilized. In another embodiment, utilizing an atomic layer deposition process in which layers comprise approximately 5.0 Å, 100 two-precursor cycles, for example. It should be noted that atomic layer deposition may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other dopant comprising an electron back-donating material and BY), of atomic layer deposition, a CEM device film may undergo in situ annealing, which may permit improvement of film properties or may be used to incorporate a dopant comprising an electron back-donating material, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In particular embodiments, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacent to first and second CEM devices, respectively.

In a further embodiment, one or more of a plurality of CEM devices may be positioned within two or more levels of an integrated circuit at one or more intersections of electrically conductive traces of a first level and electrically conductive traces of a second level, which may be positioned over the first level of conductive traces. In this context a "conductive trace" as the term is used herein, means a conductor that routes an electrical current from a first location to a second location of a layer of a multi-level CEM switching device. For example, a conductive trace may transport electrical current to or from an access device located at an intersection of a conductive trace of first level and a conductive trace of the second level. In certain embodiments, fabrication of a switching device formed from a multi-level CEM device, such as devices formed utilizing conductive traces positioned at multiple levels of a CEM switching device may be utilized in a CEM-based memory devices in which conductive traces positioned at multiple levels may facilitate an increase in bit line density, for example. Increases in bit line density may bring about more efficient and/or more highly integrated approaches toward controlling access to memory cells of CEM-based random access memory arrays, for example.

Also in this context, a "level" as the term is used herein, means a discrete surface, which a conductive trace or other device may traverse, wherein the discrete surface is separated from discrete surfaces immediately above and/or immediately below, by an insulating material. For example, as described herein, a conductive trace traversing a first level may be separated from a conductive trace traversing a second level by an insulating material, such as silicon nitride. In this context, a "multi-level" switching device, as the term is used herein, means a device to perform a switching function, such as from a high-impedance state to a low-impedance state, utilizing two or more of the above-described "levels."

Figure 2A:
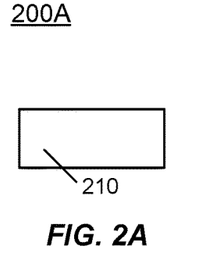
FIGS. 2A-2J illustrate embodiments of sub-processes, which may be utilized to fabricate a multi-level switching device formed from a correlated electron material.
Figure 2B:
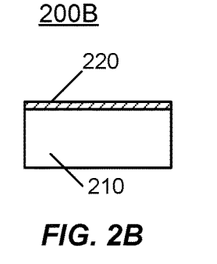

FIGS. 2A-2J illustrate embodiments of sub-processes that may be utilized to fabricate a switching device formed from multi-levels of correlated electron material. In FIG. 2A, which corresponds to embodiment 200A, an insulating substrate, such as insulating substrate 210, for example, may comprise SiN having an atomic concentration of at least 90.0%. In embodiments, substrate 210 may be deposited utilizing any suitable process. Suitable processes may include, without limitation, physical vapor deposition (PVD), metal-organic chemical vapor deposition (MOCVD), atomic layer deposition (ALD), and so forth, and claimed subject matter is not limited in this respect. After formation of insulating substrate 210, conductive material 220 may be deposited on or over a surface of the insulating substrate, such as shown in FIG. 2B, which corresponds to embodiment 200B. In embodiment 200B, just as an example, conductive material 220 comprises Ni; however, in other embodiments, conductive material 220 may comprise any transition metal, transition metal oxide, and/or any other d-block or f-block element, or alloy thereof, having an atomic concentration of at least 90.0%, for example.

Figure 2C:
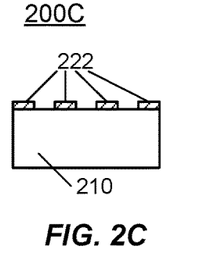
Figure 2D:
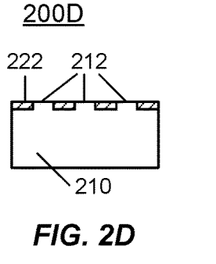

In FIG. 2C, which corresponds to embodiment 200C, conductive material 220 may be etched so as to give rise to conductive traces 222, which may extend in two dimensions on the surface of insulating substrate 210. Etching of conductive material 220 to bring about conductive traces 222 may be achieved by way of any suitable process, such as processes that utilize patterned photoresist masks, for example, and claimed subject matter is not limited in this respect. After etching of conductive material 220, additional insulating material 212 may be deposited in between conductive traces 222, such as shown in FIG. 2D, which corresponds to embodiment 200D. In embodiments, additional insulating material 212 may comprise SiN, utilized to form insulating substrate 210 of embodiment 200A, may be deposited in between conductive traces 222. The sub-process of embodiment 200D may further comprise chemical-mechanical planarization (CMP), which may operate to remove excess portions of insulating material 212. Accordingly, conductive traces 222, separated by additional insulating material 212, may form a substantially planar surface. The substantially planar surface may accommodate additional layers of insulating material, such as SiN, on or over conductive traces 222.

Figure 2E:
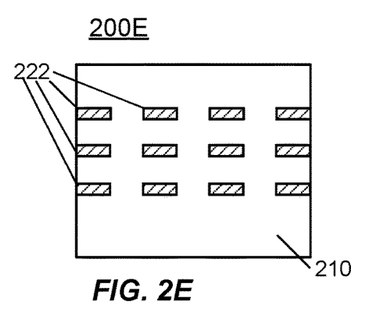

In FIG. 2E, which corresponds to embodiment 200E, additional conductive traces 222 and insulating material 212 are shown as deposited so as to form a multi-level device. Embodiment 200E may be brought about by repeating the sub-processes of embodiments 200B-200D, which may be utilized to build additional levels of conductive traces surrounded by insulating material. It should be noted that although the structure of FIG. 2E indicates 12 conductive traces distributed over three levels of a multi-level structure, embodiments may include multi-level structures comprising fewer levels, such as two levels, for example, or may include a greater number of levels, such as four levels, eight levels, 16 levels, 32 levels, etc. Additionally, although individual levels of the multi-level structure of FIG. 2E show four conductive traces, embodiments of a multi-level structure may include levels comprising fewer conductive traces, such as three conductive traces, for example, or may include a greater number of conductive traces, such as 10 conductive traces, 20 conductive traces, hundreds of conductive traces, thousands of conductive traces, or an even greater numbers of conductive traces and claimed subject matter is not limited in these respects.

Figure 2F:
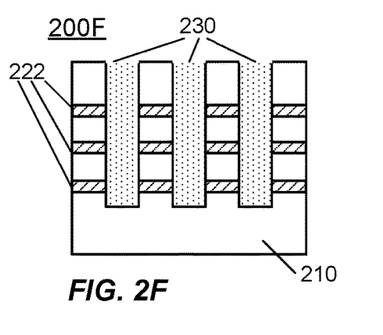

In FIG. 2F, which corresponds to embodiment 200F, voids 230 are shown formed in a multi-level CEM device. In this context, a "void" as the term is used herein, means a cavity or hole, or other absence of material, such as an absence of material in a structure, which may comprise a substrate. According to embodiments, a hole or a void may be formed, for example, by way of an etching process or a patterning process, which may include use of a photoresist mask, for example. It should be understood, however, that this is merely an example of an approach toward forming a hole or a void, and claimed subject matter is not limited in this respect. In embodiments, voids, such as voids 230, for example, may be etched responsive to use of a masking material (e.g., photoresist), which may be followed by a patterning operation and etching. In embodiments, a photoresist process may be supplemented utilizing a hard mask material, which may etch at a decreased rate relative to a photoresist process. In particular embodiments, use of a photoresist material may provide a pattern in a hard mask in which the hard mask may be utilized to mask off one or more areas of a surface of a multi-level CEM device within which etching is not desired. In certain embodiments, an etching process may comprise a dry etch or a wet etch, for example, or may involve reactive ion/plasma in a manner that accords with high-aspect ratio etching of dynamic random access memory, for example, or may utilize an etching processes that accord with an etching processes utilized in fabrication of three-dimensional NAND flash memory. It should be noted that embodiment 200F may utilize other processes to give rise to formation of voids 230 and claimed subject matter is not limited in this respect.

Figure 2G:
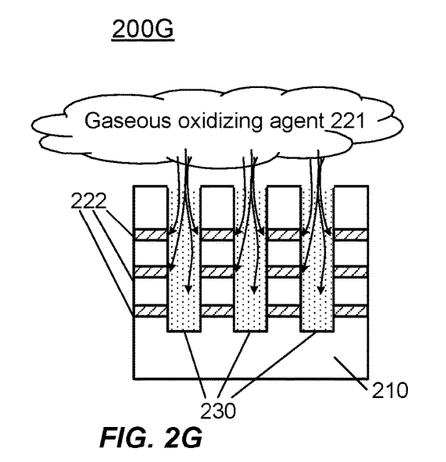

In FIG. 2G, which corresponds to embodiment 200G, a multi-level CEM device is shown as exposed to gaseous oxidizing agent 221. In this context, as the term is used herein, a gaseous oxidizing agent means a gas comprising oxygen-containing molecules such as, for example, $O_2$, $O_3$, oxygen radicals (e.g., $O^*$), $H_2O_2$, or $H_2O$, or any combination thereof. In embodiments, gaseous oxidizing agent 221 may drift into voids 230, which may give rise to oxidation of localized portions of conductive traces 222, thereby converting the localized portions of conductive traces 222 to a CEM (shown as localized CEM portion 240 in FIGS. 2I-2J). In one particular embodiment, in which conductive traces 222 comprise Ni in an atomic concentration of greater than 90.0%, gaseous $O_2$, for example, may operate to convert particular localized portions of conductive traces 222, such as localized portions in contact or proximate with voids 230, to NiO, for example. In other embodiments, such as embodiments in which conductive traces 222 comprise metals selected from the d-block or the f-block of the periodic table of elements, other oxides exhibiting CEM behavior may be formed. In certain embodiments, gaseous oxidizing agent 221, insulating material 212 and substrate 210 are selected so as to be substantially unreactive with one another. Accordingly, although insulating material 212 may be exposed to gaseous oxidizing agent 221, such exposure may be unlikely to give rise to chemical reactions between oxidizing agent 221 and insulating material 212.

In particular embodiments, a dopant may be utilized to increase P-type behavior of a CEM, such as a CEM converted from particular localized portions of conductive traces 222. Thus, in certain embodiments, a dopant, such as carbon, may be deposited along with a metal organic precursor during fabrication of conductive traces 222. Alternatively a carbon-containing source may be utilized to sputter carbon, which may permit incorporation of sufficient carbon, such as carbon in an atomic concentration of between 0.1% and 10.0%, for example, into conductive traces 222, which may thereby form NiO:CO responsive to exposure to gaseous oxidizing agent 221. In other embodiments, a dopant may be included in gaseous oxidizing agent 221 to bring about a suitable concentration of carbon in localized portions of conductive traces 222, which may be converted to CEM.

Figure 2H:
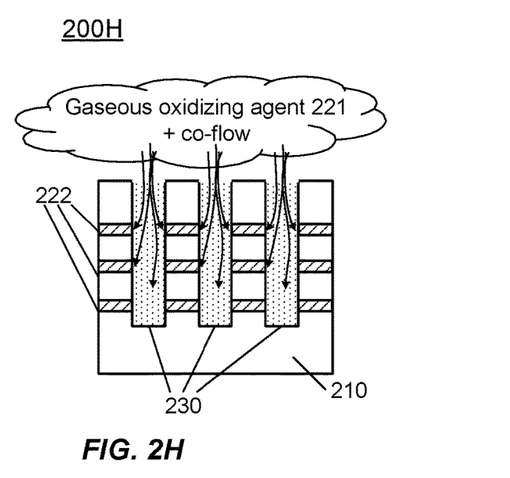

In FIG. 2H, which corresponds to embodiment 200H, a multi-level CEM device is shown as exposed to gaseous oxidizing agent 221, which may comprise one or more oxidizing agents described with respect to embodiment 200G (e.g., $O_2$, $O_3$, oxygen radicals (e.g., $O^*$), or $H_2O$, or any combination thereof). However, in embodiment 200H, gaseous oxidizing agent 221 may co-flow with one or more gaseous nitrogen-based molecular P-type dopants, such as NO, $NO_2$, $NH_3$ or nitrogen radicals ($NO^*$), or any combination thereof, in an atomic concentration of at least 50.0%, for example. In this context, as the term is used herein, a gaseous oxidizing agent that is co-flowed with a nitrogen-based molecular P-type dopant forms a gaseous oxynitriding agent. For example, an oxidizing agent, such as $O_2$, $O_3$, or oxygen radicals (e.g., $O^*$), that is combined (e.g., co-flowed) with NO, $NO_2$, $NH_3$, nitrogen radicals (e.g., $NO^*$), forms a gaseous oxynitriding agent. In embodiments, exposure of a multi-level CEM device may occur utilizing a pressure approximately in the range of from 13.0 Pa (0.0975 Torr) to 500.0 kPa (to 3800.0 Torr). Exposure temperatures comprise values approximately in the range of 23° C. to 1100.0° C. in particular embodiments. However, in certain embodiments, exposure temperatures may comprise values in a more limited range, such as from 50.0° C. to 900.0° C. Exposure times comprise values approximately in the range of 1.0 seconds to 5.0 hours. However, in certain embodiments, exposure times may include more narrow durations such as, for example, durations approximately in the range of 1.0 seconds to 1.0 hours. However, claimed subject matter is intended to embrace any appropriate pressure ranges, temperature ranges, and exposure times.

Figure 2I:
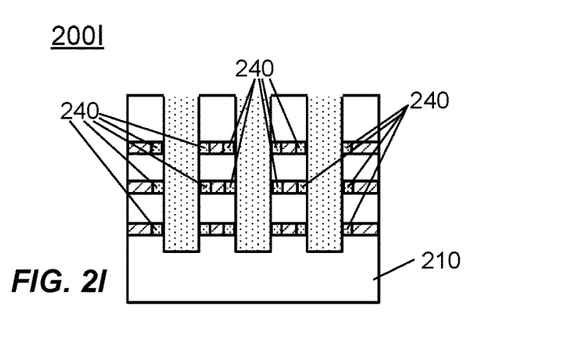
Figure 2J:
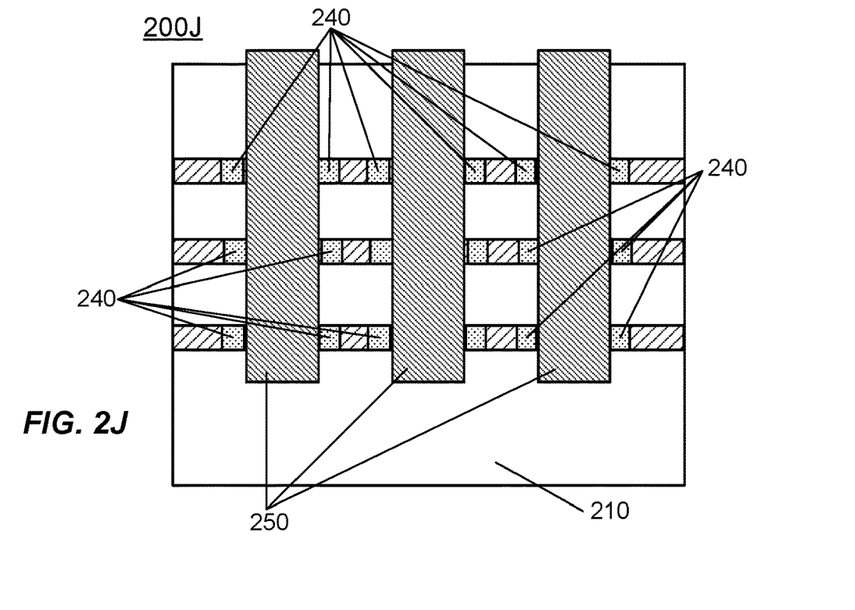

Accordingly, gaseous oxidizing agent 221, in combination with the one or more gaseous nitrogen-based molecular P-type dopants, may drift into voids 230, which may operate to convert localized portions of conductive traces 222 to a CEM (such as localized CEM portion 240 of FIGS. 2I-2J). In one particular embodiment, in which conductive traces 222 comprise Ni in an atomic concentration of greater than 90.0%, gaseous $NH_3$ (which may co-flow with gaseous oxidizing agent 221) may convert particular localized portions of conductive traces 222, such as localized portions in contact with or proximate to voids 230, to $NiO:NH_3$, for example. In another embodiment, a nitrogen-based P-type dopant may be incorporated into localized portions of conductive traces 222 by way of sputtering a metal nitride. In embodiments, responsive to exposure of conductive traces to gaseous oxidizing agent 221 combined with a gaseous nitrogen-based P-type dopant, may form a CEM. In another embodiment, a nitrogen-based P-type dopant may be included in localized portions of conductive traces 222 converted to CEM by utilizing an amine precursor in a gaseous form, such as utilizing molecules in a form corresponding to $C_xH_yN_z$ (wherein x≥0, y≥0, z≥0, and wherein at least x, y, or z comprise values>0) such as: cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example.

In embodiments 200G and/or 200H (FIGS. 2G and 2H), a P-type dopant may be incorporated into localized portions of conductive traces 222 converted to CEM during an annealing sub-process, which may occur after exposure of voids 230 to gaseous oxidizing agent 221. For example, an annealing sub-process, which may be performed separate from an oxidation/oxynitridation sub-process, may comprise exposure of voids 230 to a carbon-rich gas such as methane or acetylene, just to name a few examples, which may permit formation of $NiO:CO$ at localized portions of conductive traces 222 converted to CEM. In another embodiment, an annealing sub-process may comprise exposure of voids 230 to a nitrogen-rich gas, such as gaseous ammonia, which may permit formation of $NiO:NH_3$ at localized portions of conductive traces 222 converted to CEM.

In FIG. 2I, which corresponds to embodiment 200I, localized portions of conductive traces 222, located at adjacent sides of individual ones of voids 230, are shown as having been converted to CEM. Localized CEM portions 240 may occur in response to exposure of voids 230 to gaseous oxidizing agent 221, with or without a co-flow comprising one or more gaseous nitrogen-based molecular P-type dopants, for example. As previously described herein, localized CEM portions 240 may include one or more P-type molecular dopants, such as CO or $NH_3$ to form $NiO:CO$ or $NiO:NH_3$. Accordingly, in an embodiment, if conductive traces 222 comprise an atomic concentration of at least 90.0% Ni, localized CEM portions 240 may comprise between 0.1% and 10.0% of $NiO:CO$. Alternatively, in an embodiment, localized CEM portions 240 may comprise between 0.1% and 10.0% $NiO:NH_3$.

In FIG. 2J, which corresponds to embodiment 200J, electrodes 250 are shown as having been formed within voids 230 to be in contact with localized CEM portions 240. In particular embodiments, electrodes 250 comprise TiN, which may be fabricated in layers. In other embodiments, electrodes 250 may comprise d-block or f-block materials other than titanium, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or alloys thereof, and claimed subject matter is not limited to any particular composition of electrodes 250. After depositing electrodes 250 to be in contact with localized CEM portions 240, the CEM device of FIG. 2J may undergo chemical-mechanical planarization (CMP) to remove excess metal from a surface of the CEM device.

Figure 3A:
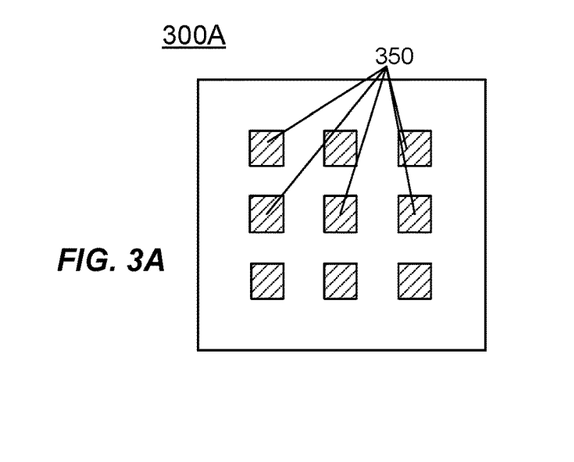
FIGS. 3A-3B illustrate an embodiment of a multi-level switching device formed from a correlated electron material.

FIG. 3A shows a view of a surface of an embodiment 300A of a multi-level switching device formed from a correlated electron material. In FIG. 3A, electrodes 350 may be similar to electrodes 250, previously described herein. Although FIG. 3A shows only nine of electrodes 350 arranged in a two-dimensional array comprising three rows, embodiments of claimed subject matter may include different arrangements of a two-dimensional array of electrodes, such as electrodes arranged in fewer rows (such as two rows) or electrodes arranged in a greater number of rows, such as four rows, five rows, eight rows, etc. Additionally, although a total of nine electrodes are shown in the two-dimensional array of FIG. 3A, embodiments of claimed subject matter may include fewer electrodes, such as six electrodes, for example, or a greater number of electrodes, such as ten electrodes, 15 electrodes, 64 electrodes, or any other number of electrodes, virtually without limitation.

Figure 3B:
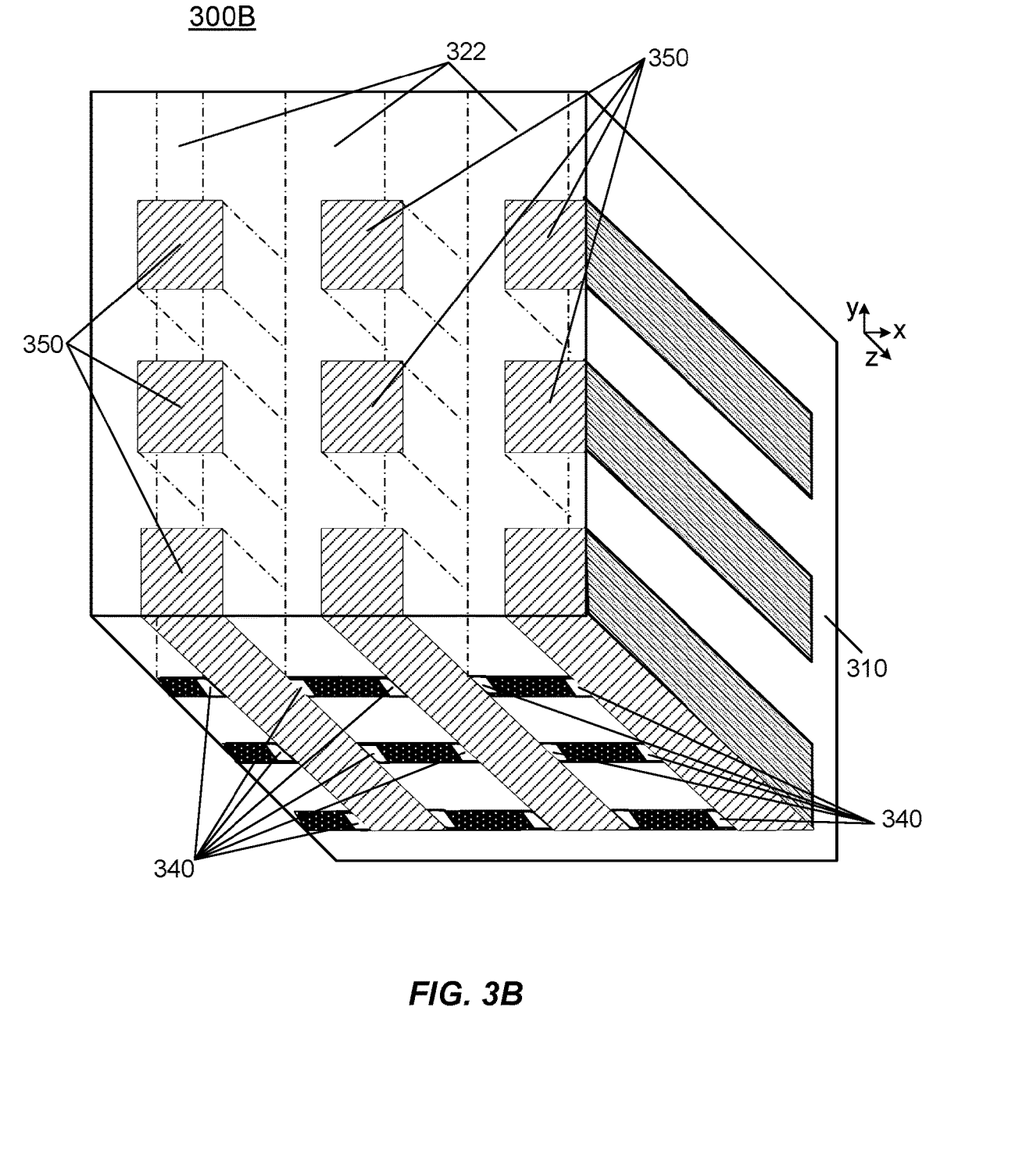

FIG. 3B shows a perspective view of a surface of an embodiment 300B of a multi-level switching device formed from a correlated electron material. Embodiment 300B comprises a switching device similar to that of previously-described embodiments, except that a portion of the switching device has been removed so as to show electrodes 350 extending in a +z direction toward substrate 310. Electrodes 350 are shown as contacting localized CEM portions 340, located to the sides of electrodes 350, in which localized CEM portions 340 may be formed in a manner similar to the manner used to form localized CEM portions 240, as previously described herein. In the embodiment of FIG. 3B, conductive traces 322, which may be fabricated in a manner similar to the fabrication of conductive traces 222, as previously described, are shown as buried within the switching device. Dotted lines in FIG. 3B are used to depict buried portions of conductive traces 322, as well as portions of electrodes 350 extending in a +z direction.

Figure 4A:
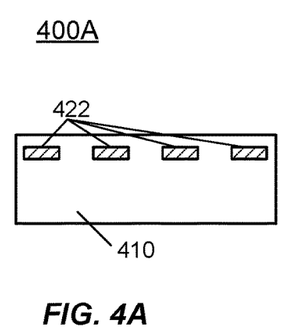
FIGS. 4A-4D illustrate embodiments of a sub-processes utilized to fabricate a switching device formed from a correlated electron material.

FIGS. 4A-4D illustrate embodiments of sub-processes utilized to fabricate a switching device formed from a correlated electron material. In FIG. 4A, which may correspond to embodiment 400A, insulating substrate 410, which may be similar to insulating substrate 210 of FIG. 2A, for example, may comprise SiN in an atomic concentration of at least 85.0%. In embodiments substrate 410 may be deposited utilizing one or more suitable processes, including, without limitation, physical vapor deposition (PVD), metal-organic chemical vapor deposition (MOCVD), atomic layer deposition (ALD), and so forth, and claimed subject matter is not limited in this respect. After formation of insulating substrate 410, a conductive material may be deposited on or over a surface of insulating substrate 410. The conductive material may be etched so as to give rise to conductive traces 422, which may extend in a horizontal plane, for example. Etching of a conductive material to bring about conductive traces 222 may be achieved by way of a suitable process, such as processes that utilize patterned photoresist masks, for example, and claimed subject matter is not limited in this respect. After etching of a conductive material, additional insulating material may be deposited on and/or in between conductive traces. In embodiments, insulating material deposited on and/or in between conductive traces 422 may comprise SiN, although claimed subject matter is not limited in this respect.

Figure 4B:
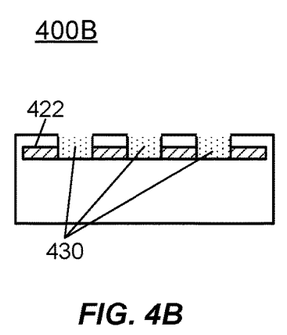

In FIG. 4B, which corresponds to embodiment 400B, voids 430 are shown formed in a CEM device. In embodiments, voids 430, for example, may be etched responsive to use of a masking material, such as photoresist, which may be followed by a patterning operation and etching in a manner similar to formation of voids 230 of FIG. 2F, for example. It should be noted that embodiment 400B may utilize other processes to give rise to formation of voids 430 and claimed subject matter is not limited in this respect.

Figure 4C:
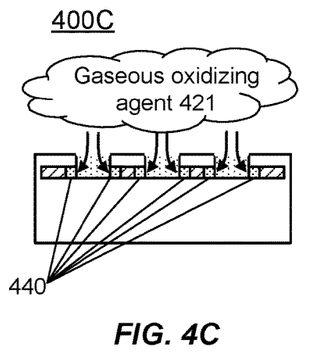

In FIG. 4C, which corresponds to embodiment 400C, a CEM device is shown as exposed to gaseous oxidizing agent 421, which may operate similar to that of gaseous oxidizing agent 221 of FIG. 2G, for example. Alternatively, a gaseous oxidizing agent may operate with one or more gaseous nitrogen-based molecular P-type dopants, such as NO, $NO_2$, $NH_3$, nitrogen radicals (NO*), or any combination thereof, for example. In embodiments, gaseous oxidizing agent 421 may drift into voids 430, which may give rise to oxidation of localized portions of conductive traces 422, thereby converting localized portions of conductive traces 422 to a CEM (shown as localized CEM portion 440 in FIG. 4C). In one particular embodiment, in which conductive traces 422 comprise Ni, or a Ni alloy, in an atomic concentration of greater than 90.0%, gaseous $O_2$, for example, may operate to convert particular localized portions of conductive traces 422, such as portions in contact or proximate with voids 430, to NiO, for example. In other embodiments, such as embodiments in which conductive traces 422 comprise metals selected from the d-block or the f-block of the periodic table of elements, other oxides exhibiting CEM behavior may be formed. In embodiments, localized CEM portions 440 may include one or more P-type molecular dopants, such as CO or $NH_3$ to form NiO:CO or NiO:$NH_3$. Accordingly, in an embodiment, if conductive traces 422 comprise an atomic concentration of at least 90.0% Ni, localized CEM portions 440 may comprise between 0.1% and 10.0% of NiO:CO. Alternatively, in an embodiment, localized CEM portions 440 may comprise NiO in an atomic concentration of at least 85.0%, for example, and may additionally comprise a dopant, such as $NH_3$, for example, in an atomic concentration of between 0.1% and 15.0%.

Figure 4D:
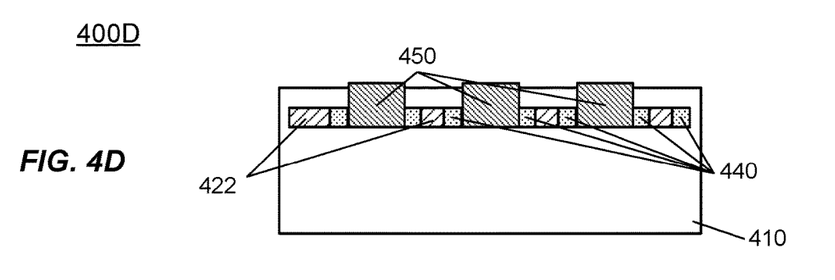

In FIG. 4D, which corresponds to embodiment 400D, electrodes 450 are shown as having been formed within voids 430 to be in contact with localized CEM portions 440. In particular embodiments, electrodes 450 may comprise TiN, which may be fabricated in layers. In other embodiments, electrodes 450 may comprise d-block or f-block materials other than titanium, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or any combination thereof, and claimed subject matter is not limited to any particular composition of electrodes 450. After depositing electrodes 450 to be in contact with localized CEM portions 440, the CEM device of FIG. 4D may undergo chemical-mechanical planarization (CMP) to remove excess metal from a surface of the CEM device.

Figure 5:
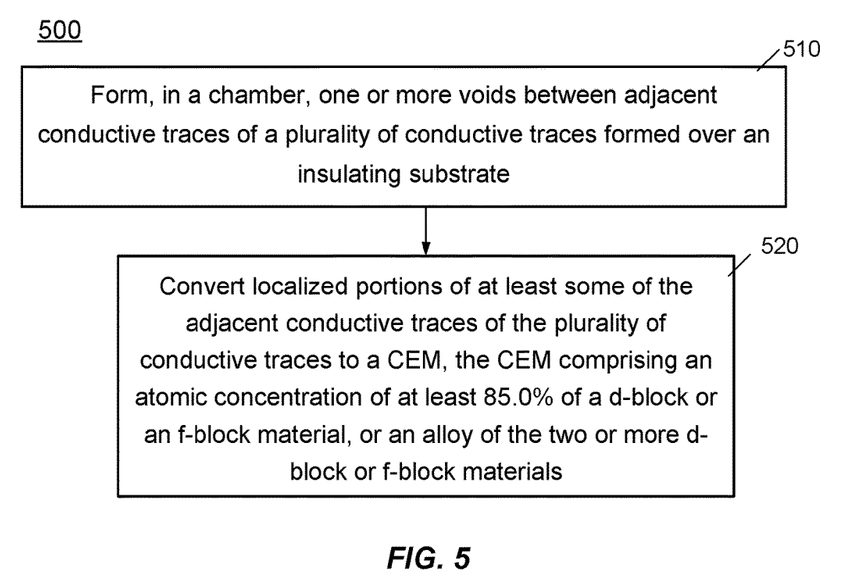
FIG. 5 is a flowchart for a method of forming a switching device using correlated electron material according to an embodiment.

FIG. 5 is a flowchart for a method of forming a switching device formed from a correlated electron material according to an embodiment 500. Example implementations, such as described in FIG. 5, and other figures described herein, may include blocks in addition to those shown and described, fewer blocks, or blocks occurring in an order different than may be identified, or any combination thereof. The method may begin at block 510, which may comprise forming one or more voids between adjacent conductive traces of a plurality of conductive traces formed over an insulating substrate. In embodiments, conductive traces may be formed from titanium-based and/or titanium-containing conductive traces, such as titanium nitride (TiN), fabricated in levels, for example, for use in a CERAM device or other type of CEM-based device. In embodiments, conductive traces may comprise d-block or f-block element material other than titanium, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or any combination thereof, and claimed subject matter is not limited to any particular composition of conductive material. The method may continue at block 520, which may comprise converting localized portions of at least some of the adjacent conductive traces of the plurality of conductive traces to a CEM. In particular embodiments, a CEM may comprise an atomic concentration of at least 90.0% of d-block or an f-block material from the periodic table of the elements.

In embodiments, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as in a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a switching device, comprising:

forming, in a chamber, one or more voids between adjacent conductive traces of a plurality of conductive traces formed over an insulating substrate; and converting localized portions of at least some of the adjacent conductive traces of the plurality of conductive traces to a correlated electron material (CEM), the CEM comprising an atomic concentration of at least 85.0% of an oxide of a d-block element or of an oxide of an f-block element, or an alloy of two or more oxides of d-block or f-block elements.

2. The method of claim 1, wherein converting the localized portions of at least some of the adjacent conductive traces comprises exposing the one or more voids to a gaseous oxidizing agent or to a gaseous oxynitriding agent.

3. The method of claim 2, wherein the gaseous oxidizing agent comprises $O_2$, $O_3$, O* or $H_2O$, or any combination thereof, in an atomic concentration of at least 50.0%.

4. The method of claim 3, wherein the gaseous oxidizing agent comprises $O_2$, and wherein converting comprises exposing the one or more voids to gaseous CO and $CH_4$, and wherein the localized portions of the at least some of the adjacent conductive traces converted to CEM comprise an atomic concentration of about 0.1% to about 10.0% of CO.

5. The method of claim 2, wherein the gaseous oxynitriding agent comprises gaseous NO, $N_2O$ or NO*, or any combination thereof, in an atomic concentration of at least 50.0%.

6. The method of claim 5, wherein the gaseous oxynitriding agent comprises NO, and wherein converting further comprises exposing the one or more voids to gaseous $H_2O$, and wherein the localized portions of the at least some of the adjacent conductive traces converted to CEM comprise an atomic concentration of about 0.1% to about 10.0% of nitrogen.

7. The method of claim 1, further comprising exposing the one or more voids to a dopant, in a gaseous form, to bring about a concentration of the dopant in the CEM to be approximately in the range of about 0.1% to about 10.0%.

8. The method of claim 1, further comprising forming one or more electrodes within at least one of the one or more formed voids.

9. The method of claim 8, wherein the one or more electrodes contact the localized portions of the at least some of the adjacent conductive traces converted to the CEM.

10. The method of claim 8, wherein the one or more electrodes comprises at least 85.0% of platinum, titanium, copper, aluminum, cobalt, nickel, tungsten, tungsten nitride, cobalt silicide, ruthenium oxide, chromium, gold, palladium, indium tin oxide, tantalum, silver or iridium, or an alloy thereof.

* * * * *